(12) United States Patent
Franz et al.

(10) Patent No.: US 10,638,641 B2
(45) Date of Patent: Apr. 28, 2020

(54) COOLING RACK

(71) Applicant: HEWLETT PACKARD ENTERPRISE DEVELOPMENT LP, Houston, TX (US)

(72) Inventors: John Franz, Houston, TX (US); Wade D Vinson, Magnolia, TX (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/525,851

(22) PCT Filed: Nov. 14, 2014

(86) PCT No.: PCT/US2014/065643
§ 371 (c)(1),
(2) Date: May 10, 2017

(87) PCT Pub. No.: WO2016/076882
PCT Pub. Date: May 19, 2016

(65) Prior Publication Data
US 2017/0325358 A1     Nov. 9, 2017

(51) Int. Cl.
*H05K 7/20* (2006.01)

(52) U.S. Cl.
CPC ..... *H05K 7/20236* (2013.01); *H05K 7/20272* (2013.01); *H05K 7/20781* (2013.01)

(58) Field of Classification Search
CPC .. H05K 7/20236; H05K 7/20781; H05K 7/20; H05K 7/20272; H05K 7/203; H05K 7/20809; H05K 7/20772; H05K 7/20763; H05K 7/20836; H05K 7/20818; H05K 7/20327; H05K 5/067; H05K 7/20218;
(Continued)

(56) References Cited

U.S. PATENT DOCUMENTS 4,614,383 A  *  9/1986  Polley ............... H02B 1/202
                                                   174/69
6,460,098 B1    10/2002  Dieter
(Continued)

FOREIGN PATENT DOCUMENTS

CN          203136430           8/2013

OTHER PUBLICATIONS

PCT/ISA/KR, International Search Report, dated Aug. 13, 2015, PCT/US2014/065643.

*Primary Examiner* — Mandeep S Buttar
(74) *Attorney, Agent, or Firm* — International IP Law Group, PLLC

(57) ABSTRACT

The present disclosure provides a system including a cooling rack for servers, a first enclosure, and a second enclosure. The first enclosure can be coupled to the cooling rack for servers and houses electronics. The second enclosure can be coupled to the cooling rack for servers beneath the first enclosure with a minimal sliding clearance in between the two enclosures. The second enclosure also holds an electronics cartridge and connects to the cooling rack for servers via a slide that enables the second enclosure to slide out from under the first enclosure so that the electronics cartridge can be removed from a top of the enclosure. Further, the second enclosure may contain a fluid to immerse components and absorb heat from the electronics cartridge.

15 Claims, 5 Drawing Sheets

(58) Field of Classification Search
CPC .... H05K 5/0247; H05K 7/1487; H05K 7/023; H05K 7/20727; H05K 2201/064; H01L 2924/0002; H01L 2924/00; H01L 23/473
USPC ..... 361/679.46, 699, 679.53, 688, 689, 698; 165/104.33, 104.21, 80.4, 104.11
See application file for complete search history.

(56) References Cited

U.S. PATENT DOCUMENTS

| | | | |
|---|---|---|---|
| 6,671,160 B2 * | 12/2003 | Hayden | H05F 3/02 361/212 |
| 6,934,150 B2 | 8/2005 | Kitchen | |
| 6,973,801 B1 | 12/2005 | Campbell | |
| 7,473,846 B2 * | 1/2009 | Doerr | H05K 7/1491 174/68.3 |
| 7,885,070 B2 | 2/2011 | Campbell | |
| 7,911,793 B2 | 3/2011 | Attlesey | |
| 8,179,677 B2 | 5/2012 | Campbell | |
| 9,380,728 B1 * | 6/2016 | Dunwoody | H05K 7/20709 |
| 2005/0145582 A1 * | 7/2005 | Dubon | H02G 3/128 211/26 |
| 2006/0023422 A1 | 2/2006 | Shum | |
| 2010/0246118 A1 * | 9/2010 | Attlesey | G06F 1/20 361/679.53 |
| 2010/0313590 A1 | 12/2010 | Campbell | |
| 2011/0132579 A1 | 6/2011 | Best | |
| 2013/0043775 A1 * | 2/2013 | Chen | H05K 7/20781 312/236 |
| 2014/0085821 A1 | 3/2014 | Regimbal | |
| 2016/0186896 A1 * | 6/2016 | Ellsworth, Jr. | H02G 15/22 138/126 |
| 2017/0290202 A1 * | 10/2017 | Shah | G06F 1/1632 |

\* cited by examiner

100

COOLING RACK

BACKGROUND

Server Racks are designed to hold a variety of technologies including information technology (IT), processors, storage, power supplies, networking equipment, input/output ports, and other related technologies. Some of these technologies generate heat that can cause overheating if not properly cooled. Server racks can be designed in a number of ways that increases the possible density of the rack. The rack may also be configured to allow servicing of components by a user or technician.

BRIEF DESCRIPTION OF THE DRAWINGS

Certain examples are described in the following detailed description and in reference to the drawings, in which.

DETAILED DESCRIPTION OF SPECIFIC EXAMPLES

A rack, database rack, or server reach may each have multiple functions that go beyond a simple structure for holding components. A rack may be designed not only to hold servers, but also storage technology, additional processors, or any other similar technology. Each electronic component stored in the rack can be a separate server, blade, cartridge, networking card, input/output port, power supply, or any other number of electronics. The design of these racks can vary based on their purpose and usage. However, most racks house at least some form of cooling. The cooling can take a variety of forms.

One form of cooling discussed herein includes completely immersing a heat bearing components in a coolant. This coolant may be cycled throughout the rack through a series of hoses and connected centrally to a cooling distribution unit (CDU). In order to allow servicing of racks, each enclosure may slide out to enable a service person or technician to access the components. This sliding feature also enables a denser rack. Racks that do not have slide enclosures or do not allow top accessible components usually have additional empty space above each enclosure in order to enable access to the components therein. By contrast and as discussed herein, racks with sliding enclosure capability enable the removal of a chassis or any internal components without using additional empty space above and below. Accordingly, the removal and insertion of an enclosure into a rack is possible with a smaller amount of space. A server rack herein generally shows a rack that allows top loading cartridges to be immersed in fluid cooling with a sliding enclosure configuration minimizing unused space in the server rack.

Figure 1:
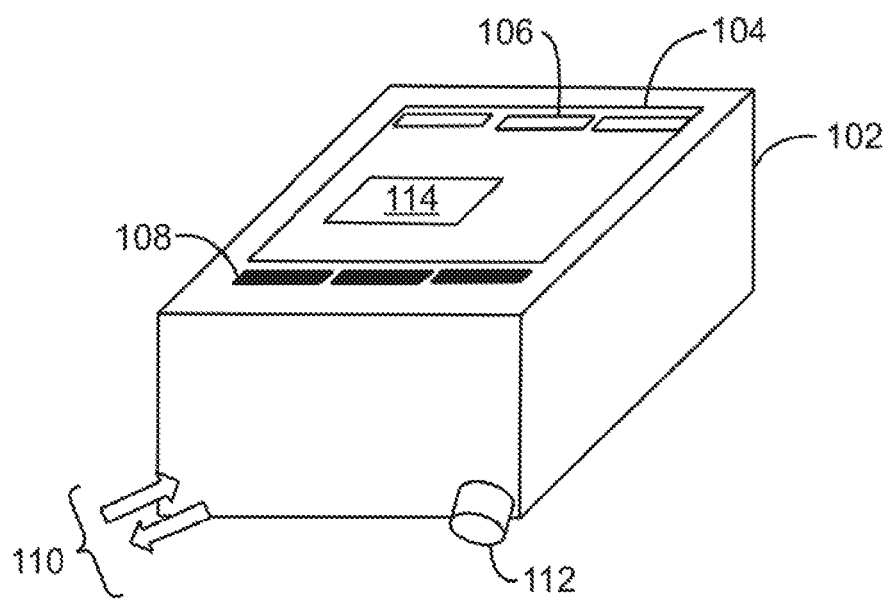
FIG. 1 is a diagram of a chassis for holding top access cartridges and a cooling enclosure, according to an example.

FIG. 1 is a diagram of a chassis for holding top access cartridges and a cooling enclosure 100, according to an example. The enclosure 100 keeps leaks contained and is open on one side to allow access from above the enclosure 100. The enclosure enables current server rack equipment to be used with the immersion technology. In some examples, the enclosure 100 is not removable from a rack. In some examples, the enclosure 100 is removable from the rack and accordingly can also be inserted into racks not built to hold the nonremovable enclosure 100. The enclosure 100 contains leaks and holds the various technology within an external enclosure 102. The external enclosure contains a chassis 104 which may hold a top loading cartridge system for cartridges slots 106. Each cartridge slot 106 may hold an IT cartridge such that may include hard drive disks, solid state disks, processing units, or any other similar IT technology. Each cartridge slot 106 can be positioned in the chassis 104 such that the chassis and the cartridge slots 106 are immersed in a fluid or coolant. In some examples, a fluid immersing cartridges and held by the chassis 104 is oil but could also include water, air, or any other fluid coolant.

External to the chassis 104 but internal to the external enclosure 102, other cartridge openings 108 may also be included. These other cartridge openings 108 may hold additional IT cartridges, but could also hold components that do not require the same level of cooling as the cartridges housed inside the chassis 104. These additional components could include power sources, power converters, input/output ports, switches, fans, pumps or may simply be empty space where connecting hoses for fluid cooling and connectivity are stored. Other similar components may also occupy these other component cartridge openings 108.

Hoses 110 may pass through the external enclosure 102. The hoses 110 allow fluid to pass into and out of the enclosure 100 for cooling. The liquid may include oil, water, or any other liquid coolant. In some examples, water could be used to cool a liquid to liquid heat exchanger housed within a cartridge opening 108 or within a cartridge slot 106. Alternatively, a liquid to liquid heat exchanger, or other cooling mechanism, could be located within the external enclosure 102, but not immersed in the liquid contained in the chassis 104. In yet another alternative, the cooling mechanism could immerse a liquid-to-liquid heat exchanger in the fluid in the chassis 104.

The hoses 110 may also contain power transmitting wiring and may also contain connectivity or other wiring to allow powering and a physical connection to the components in the enclosure 100. The external enclosure 102 may include a drain 112. A drain 112 provides a means for removing a fluid coolant from inside the enclosure 100. A circulating pump 114 may be included in either the external enclosure 102 or the chassis 104, or both to aid in circulating coolant. The circulating pump 114 may also be directing the coolant to or from a particular region of the chassis, a particular IT cartridge in a cartridge opening 108. Further, the pump 114 is not limited to directional circulation. In some examples, the circulating pump 114 may be connected to one or more of the hoses 110 for delivering coolant to the enclosure 100. The circulating pump 114 may aid in providing a particular pressure, speed, or volume of coolant being delivered from one or more of the hoses 110. Likewise, the circulating pump 114 attached to another one of the hoses 110 could regulate pressure, speed, or volume of coolant being removed from the enclosure 100. In some examples for a circulating pump at a component level, perhaps a CPU card may benefit less from a dedicated circulating pump than a GPU card that was generating more heat due to increased load.

Figure 2:
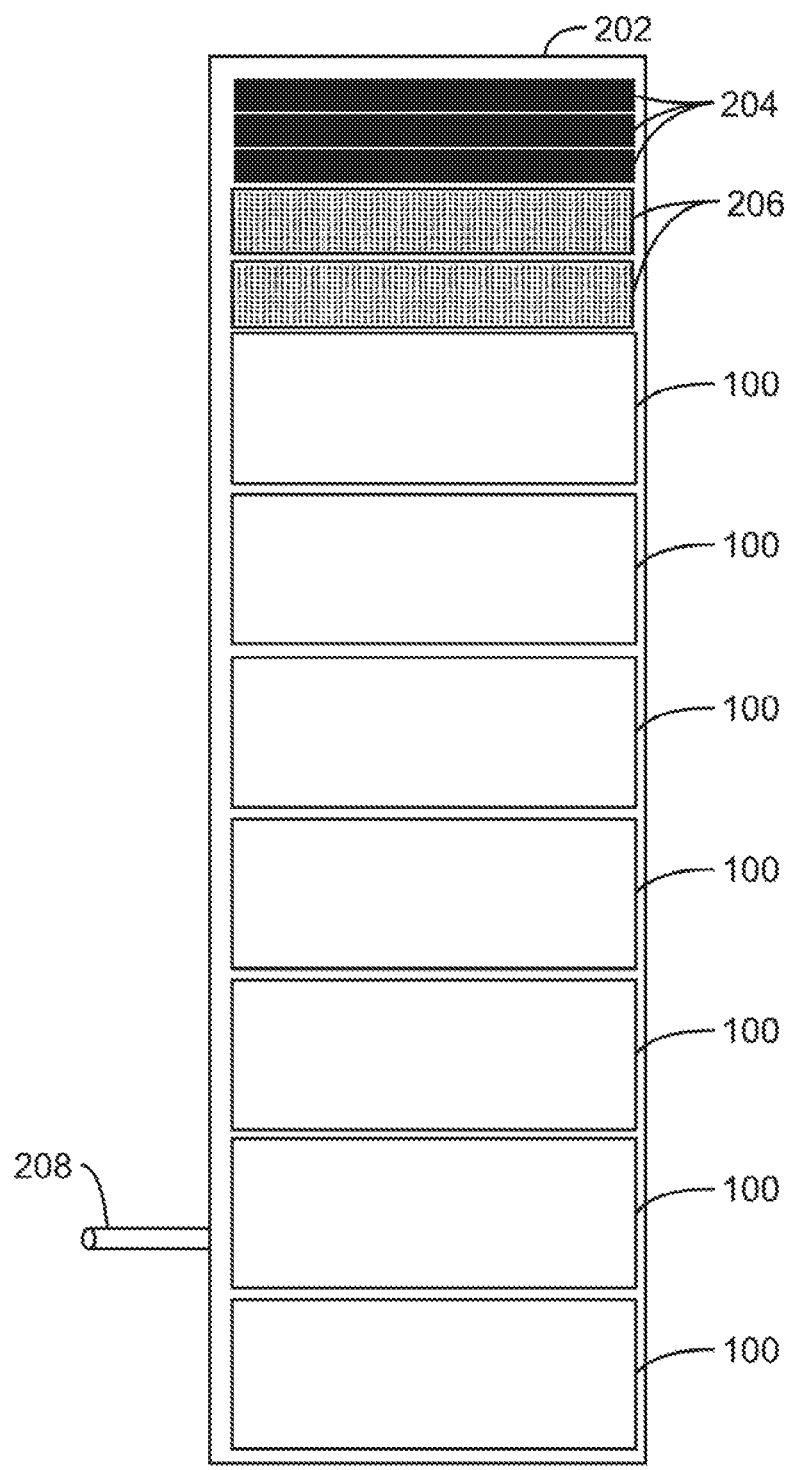
FIG. 2 is a block diagram of an example rack with no internal cooling distribution unit, according to an example.

FIG. 2 is a block diagram of an example rack 200 with no internal cooling distribution unit, according to an example. The rack frame 202 is a frame that can hold multiple components including power supplies 204, switches, 206, and enclosures 100. In some examples, the enclosure 104 contains information technology. The power supplies 204 can be any power supply capable of supplying power to the components stored in the rack from 202. Each power supply 204 may be a high voltage direct current (HVDC) units, battery backups, or any other similar power technology. Each switch 206 can be any device or component capable of connecting together the components in the rack from 202, or components and systems external to the rack frame 202. Each enclosure 100 may house a number of IT components. Each IT system may include a server or server technology. As detailed in FIG. 4A, these enclosures 100 may be mounted on slides that allow each enclosure 100 to slide in and out of the rack from 202. This movement allows an enclosure 100 to be slid out to be accessed by a technician or user in order to service components within the enclosure 100. This mounting also allows the enclosures 100 to be placed closer together, with only a minimal sliding clearance distance from other surrounding components. A minimal distance, or minimal sliding clearance distance is a distance that allows enough space for the sliding in and out of surrounding components but otherwise does not include a distance beyond that which would allow for access of the component without either sliding it out or removing it from the rack frame 202.

The example rack 200 can be described as a performance optimized datacenter (POD) as this embodiment is optimized to allow the maximum number of enclosures 100. One means of allowing the maximum number of enclosures 100 is having only a minimal distance between each enclosure 100. Another means of allowing a maximum number of enclosures 100 is excluding a cooling distribution (CDU) the interior of the rack frame 202. A lot of space can be taken up by a CDU, but as seen in this example, the CDU can be removed and mounted elsewhere. In some examples, a CDU may serve a plurality of racks 200 and a plurality of enclosures 100 each aggregated together to draw cooling from a CDU that is not inside any of the racks individually. In this manner the density of IT in each individual rack may be increased to fill the space formerly occupied by a CDU. In other examples the CDU may be minimized to match the particular capacity of a particular rack. In an example, the CDU is instead housed separately from the rack 200 including above the rack frame 202, adjacent to the rack frame 202, or another location that still provides cooling distribution to the rack 202, while still being external to the rack frame 202. The absence of the CDU from the rack frame 202 allows instead additional components such as additional enclosures 100. In some examples, an external CDU may provide coolant to the rack frame through an external hose 208 that carries coolant to and from the hoses 110 of each enclosure 100. Although only a single external hose 208 is shown in the figure, many hoses may be used to allow each enclosure 100 to receive coolant from the external CDU, to draw power, to connect to a network, or any other connection needed to a resource outside of the example rack 200.

Figure 3:
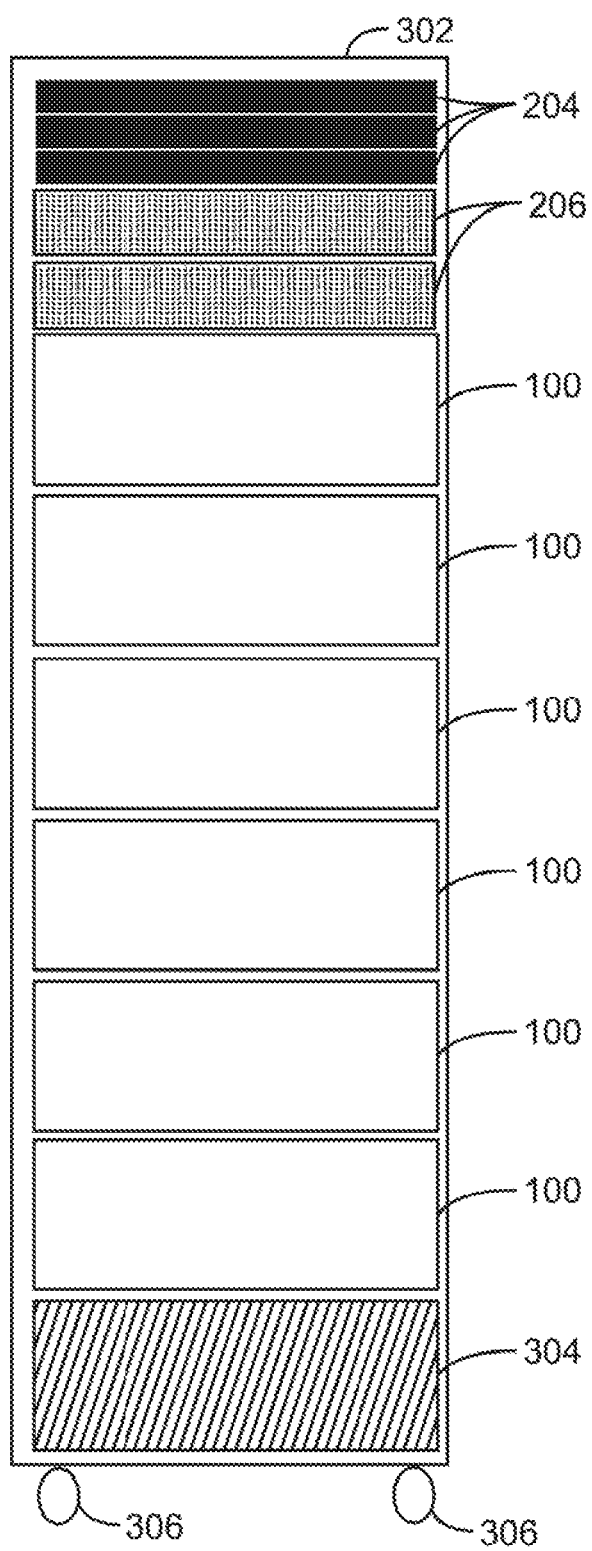
FIG. 3 is a block diagram of an example rack with an internal cooling distribution unit and wheels, according to an example.

FIG. 3 is a block diagram of an example rack with an internal cooling distribution unit and wheels, according to an example. Like numbered items are as described with respect to FIG. 2. The rack frame 302 in the data center rack 300 may also contain a cooling distribution unit (CDU) 304 and wheels 306.

The rack frame 302 as well as other rack frames here disclosed are not necessarily standard rack frames as each rack frame carrying fluid cooling should be capable of supporting the potential additional weight of components that are fluid cooled including the weight of the fluid, any additional pumps and hosing to enable the cooling system to function, and any slides used in mounting each component.

The CDU 304 may take up space in the data center rack 300 but also may be excluded in some embodiments similar to the example rack shown in FIG. 2. In some embodiments, as discussed above, the cooling mechanism of a CDU can be broken up into several smaller CDUs to be located in each individual chassis 104 or enclosure 100. The cooling mechanism of a CDU 304 can vary and can include direct exchange, liquid to liquid heat exchange, adiabatic fluid cooling, or any similar cooling method. The size of the CDU 304 depends on the capacity, redundancy and service features of a particular data center rack 300. Examples of service features include pumps, valves, drains, temperature sensors, filters, or other similar components.

Figure 4A:
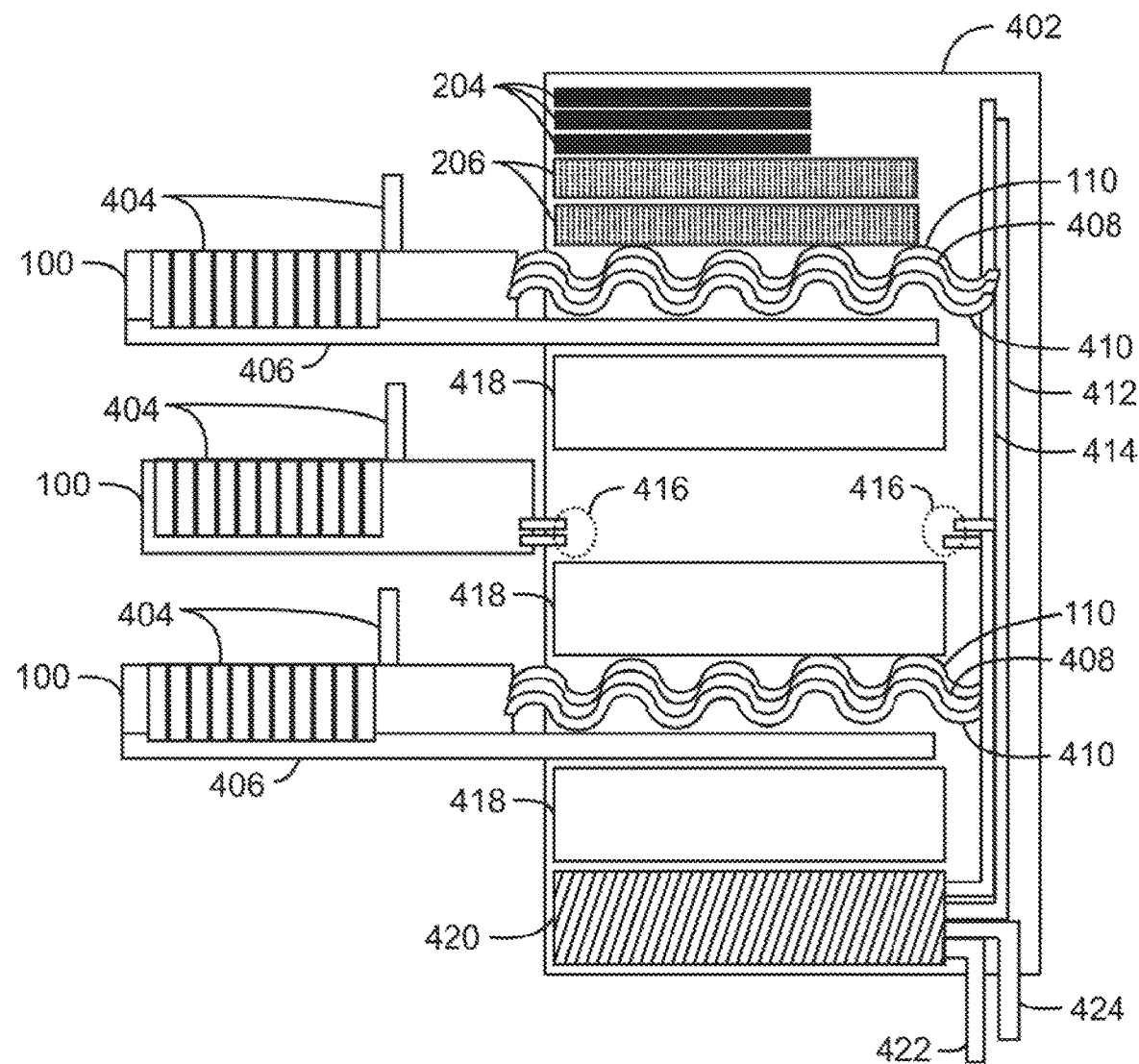
FIG. 4A is a block diagram of a profile view of a fluid immersion cooling rack with fluid immersion cooling, according to an example.

FIG. 4A is a block diagram of a profile view of a fluid immersion cooling rack 400 with fluid immersion cooling, according to an example. Like numbered items are as described with respect to FIG. 2.

A rack frame 402 can contain a number of components including enclosures 100, also known as cartridge enclosures. Each enclosure 100 can include a number of cartridges 404. These cartridges can be IT components, power supplies, switches, input output ports, or any other similar component for use in a server or data center. As seen in FIG. 4A, each cartridge 404 may be accessed from the top of the enclosure 100. The ability for each cartridge 404 to be accessed from the top of the cartridge 404 allows the four walls of the enclosure 100 to be fluid tight and hold fluid within the cartridge enclosure so that each cartridge 404 may be cooled by immersion.

Each enclosure 100 may be mounted on a slide 406 to allow the movement of the enclosure 100 in and out of the rack frame 402. Each enclosure 100 may be either placed on a slide 406, for example if it is a removable enclosure, or may also be mounted on the slide 406 more permanently. The ability of each cartridge 404 to be accessed from the top of the enclosure 100 combined with the slide 406 allowing movement of an enclosure 100 can enable each enclosure 100 to be placed within a minimal distance of surrounding components while maintaining IT density within the enclosure 100.

Additional transport connections may allow additional functionality for each enclosure 100 even when partially or fully removed from a rack frame 402. As shown in FIG. 1, hose 110 allows fluid to pass into and out of an enclosure 100 for cooling. The liquid may include oil, water, or any other liquid coolant. This hose 110 may be extendable to keep coolant flowing while the chassis 100 is extended. An extendable power hose 408 may enable a constant supply of power to the enclosure 100 and the components therein. The extendable power hose 408 itself does not need to transmit power but may instead contain wiring or components to transmit power through the power hose 408. An extendable communication hose 410 may enable constant communication to the enclosure 100 and the components therein. The extendable communication hose 410 itself does not need to propagate a communication signal but may instead contain wiring or components to allow communication through a communication signal such as an electrical or optical signal. Both the extendable power hose 408 and the extendable communication hose 410 enable the enclosure 100 to continue activity even if slid out of the rack frame 402. Although shown as three separate hoses in FIG. 4, these hoses do not need to be separately contained and may be combined together. In some examples, the equipment supplying power may be housed within the same extendable casing as the equipment supplying communications to and from an enclosure 100.

As shown, the hoses 110 provide fluid flow to the enclosure 100 even while the enclosure 100 is slid out of the rack frame 402. However, as can be appreciated for a fluid cooled system, if a fluid cooled enclosure 100 is disconnected from a fluid flow it may still continue operation, however, the heat inside the enclosure may rise until the components in the enclosure overheat and cease optimal function. Accordingly, in these embodiments, there may be a time dependent service window based on how long an enclosure 100 remains active but separated from a fluid flow. One example of this embodiment is seen in FIG. 4 where an enclosure 100 may be connected to a coolant inflow 412 and a coolant outflow 414 by connectors 416 when this enclosure is fully inside the rack frame 402. These connectors 416 may be blind mate connectors such as manual quick connects and may not extend. It should be noted however that this approach would not be as desirable for high power IT, but may be useful with low power IT that doesn't generate as much heat. With less generated heat, the removal of a system from fluid flow for servicing may be more feasible to do while still avoiding overheating. In some embodiments, there may be power management implemented such that high power devices throttle back but still retain 100% functionality during a service event requiring an enclosure 100 disconnect from fluid flow. The reduction in performance while still maintaining functionality may mitigate risk of overheating and also allow for cost reduction as the extendable fluid connection hoses 110 may not be required, while still allowing the service events that may only be occurring once a month or year.

The coolant inflow 412 and coolant outflow 414 are any kind of plumbing or transportation system including hoses, pipes, or tubes that transport coolant to and from an enclosure 100, respectively. However, the coolant inflow 412 and coolant outflow 414 may differ from the hoses 110 pictured which allow extension for an enclosure 100. A coolant inflow 412 transports coolant to the enclosure 100, and a coolant outflow 414 transports coolant out of the enclosure 100. The coolant itself may be any substance which flows and can absorb heat from an enclosure 100 or the components therein.

The connections 416 may be blind mate connections which include connections that do not require exact fastening by a user or technician, but may simply allow connection by approximately correct positioning of the connectors 416. While the connectors may be blind mate connectors, any other means of connecting the coolant inflow 412 and coolant outflow 414 to the enclosure 100 are also included in this example. In FIG. 4A, the connectors 416 are shown in a disconnected position as the enclosure 100 is slid out from the rack frame 402. It should be understood that similar disconnections may be seen in any enclosure 100 is slid out from the rack frame 402. However, as discussed above, additional extendable hoses may allow fluid flow to continue from coolant inflow 412 and coolant outflow 414 while an enclosure 100 is slid out from a rack frame 402. In these cases, the connectors 416 may exist in a form that could connect the extendable hoses to the enclosure 100.

An information technology (IT) enclosure 418 may also be included in the rack frame 402. Each IT enclosures 418 may be the same as the pictured enclosures 100, and may be connected to the pictured coolant system even though these connections are not shown. Each IT enclosure may also contain differing IT technology, connections and coolant methods. In some examples, a different style of cartridge chassis is used, for example a front loading cartridge chassis. In another example, each IT enclosure 418 need not contain components at all and may simply be empty space that an another enclosure could later fill. Each IT enclosures 418 are shown here to at least illustrate both the capability of each enclosure to be fully inside the rack frame 402 and also the interchangeability of the each enclosure space.

The rack frame 402 can also include a cooling distribution unit (CDU) 420. The CDU 420 pumps coolant through the system including the coolant inflow 412 and the coolant outflow 414. The CDU 420 can also be connected to a CDU inflow 422 and a CDU outflow 424. Depending on the type of CDU 420 the CDU inflow 422 can provide the CDU 420 with a fluid for use in the cooling process. Similarly, the CDU outflow 424 can move a fluid away from the CDU 420 as part of the cooling process. As the CDU 420 may be a liquid heat exchanger, in some examples, the CDU inflow 422 and CDU outflow 424 may be moving water to and from the CDU 420 for heat transfer with the coolant also being moved to and from the CDU 420. In the case where the CDU 420 is a liquid to liquid heat exchanger case, for example a water to oil heat exchanger, the CDU 420 would pump oil to the rack 400 and water through the CDU inflow 422 and CDU outflow 424 with the heat being transferred between the two separate fluids in the CDU 420.

Figure 4B:
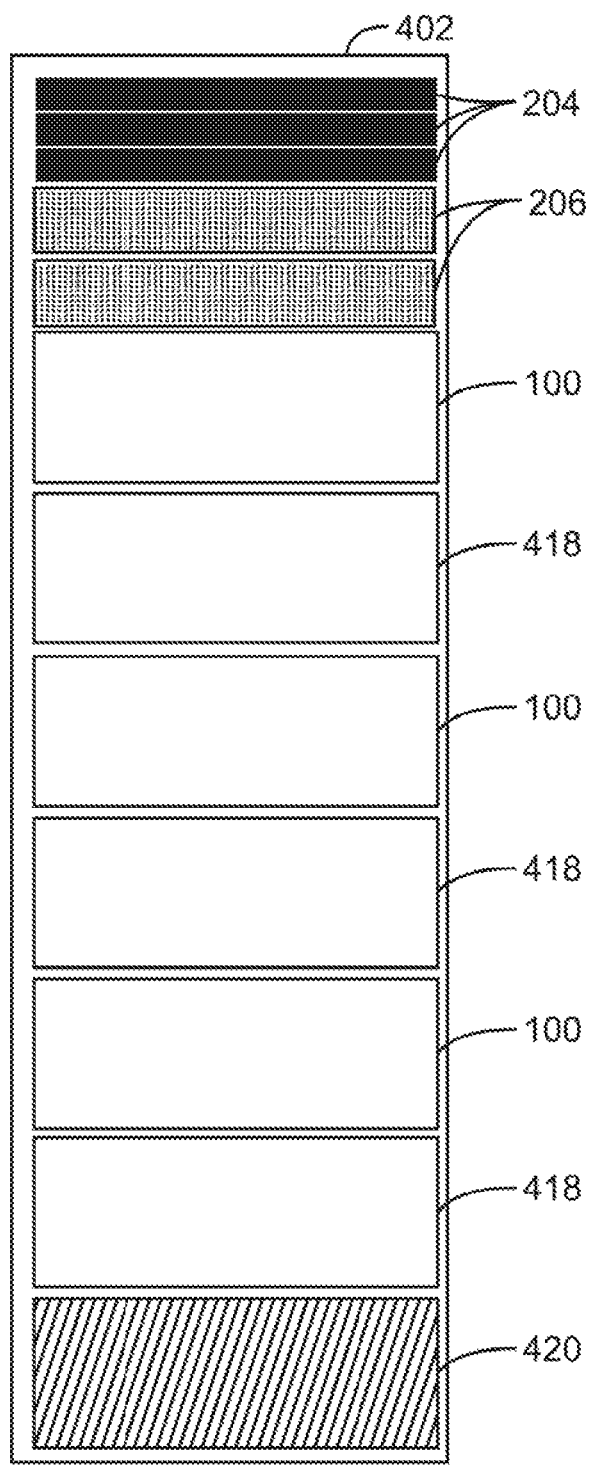
FIG. 4B is a block diagram of a front view of a fluid immersion cooling rack with fluid immersion cooling, according to an example.

FIG. 4B is a block diagram of a front view of a fluid immersion cooling rack with fluid immersion cooling, according to an example. Like numbered items are as described with respect to FIGS. 2 and 4A. This additional perspective of the fluid immersion cooling rack 400 can provides an example view of every enclosure inserted into the rack frame 402. Further, it can been seen that the distance between each enclosure 100, IT enclosure 418, the CDU 420 is minimal to allow greater utilization of space within the rack frame 402 by components including IT components.

While the present techniques may be susceptible to various modifications and alternative forms, the exemplary examples discussed above have been shown only by way of example. It is to be understood that the technique is not intended to be limited to the particular examples disclosed herein. Indeed, the present techniques include all alternatives, modifications, and equivalents falling within the true spirit and scope of the appended claims.

What is claimed is:

1. A system, comprising:
a cooling rack;
a plurality of slides including a first slide and a second slide;
a first enclosure coupled to the cooling rack via the first slide that enables the first enclosure to slide out from a retracted position to an extended position relative to the cooling rack, the first enclosure comprising cartridge slots to receive first electronic cartridges that are removable from a top of the first enclosure, and the first electronic cartridges when received in the first enclosure being immersed in a liquid coolant in the first enclosure;

a second enclosure coupled to the cooling rack via the second slide that enables the second enclosure to slide out from a retracted position to an extended position relative to the cooling rack, the second enclosure beneath the first enclosure, the second enclosure comprising cartridge slots to receive second electronic cartridges that are removable from a top of the second enclosure, and the second electronic cartridges when received in the second enclosure being immersed in the liquid coolant in the second enclosure; and a plurality of extendable hoses to provide functionality to the first enclosure and the second enclosure, wherein a first extendable hose and a second extendable hose of the plurality of extendable hoses provide different functions;

wherein:

the first electronic cartridges are removable from the top of the first enclosure in a first direction that is different from a second direction of sliding of the first enclosure from the retracted position to the extended position of the first enclosure;

the second electronic cartridges are removable from the top of the second enclosure in a third direction that is different from a fourth direction of sliding of the second enclosure from the retracted position to the extended position of the second enclosure; and the first enclosure includes a further cartridge slot to receive a further electronic cartridge, the further cartridge when received in the further cartridge slot being in a portion of the first enclosure that is without the liquid coolant.

2. The system of claim 1, comprising a circulating pump integrated into the second enclosure, the circulating pump to circulate the liquid coolant in the second enclosure.

3. The system of claim 1, comprising:
a cooling distribution unit to pump the liquid coolant through the first extendable hose to the second enclosure, wherein the first extendable hose is extendable to allow the second enclosure to slide out from under the first enclosure without stopping a flow of the liquid coolant to the second enclosure.

4. The system of claim 3, wherein the cooling distribution unit is located inside the cooling rack and is to provide the liquid coolant to each enclosure of a plurality of enclosures including the first enclosure and the second enclosure.

5. The system of claim 3, wherein the cooling distribution unit is external to the rack and is to provide the liquid coolant to a plurality of enclosures including the first enclosure and the second enclosure.

6. The system of claim 1, wherein the first extendable hose is to carry the liquid coolant to the first enclosure, and the second extendable hose is to carry power to the first enclosure.

7. The system of claim 1, comprising:
a blind mate connection that does not extend, wherein the liquid coolant is to flow to the second enclosure through the blind mate connection when the second enclosure is at the retracted position of the second enclosure in the cooling rack, wherein the blind mate connection is to stop a flow of the liquid coolant to the second enclosure when the second enclosure is slid out from under the first enclosure to the extended position of the second enclosure, and wherein the blind mate connection is to resume the flow of the liquid coolant if the second enclosure is returned from the extended position of the second enclosure to the retracted position of the second enclosure in the cooling rack.

8. The system of claim 1, further comprising a power source in a third enclosure, wherein the third enclosure contains the liquid coolant to immerse and absorb heat from the power source.

9. An apparatus for use with a cooling rack, comprising:
an enclosure comprising cartridge slots on a top side of the enclosure, the cartridge slots to receive electronic cartridges that are insertable into and removable from the top side of the enclosure, and the enclosure to hold a liquid coolant in which the electronic cartridges are immersed when the electronic cartridges are inserted in the enclosure through the cartridge slots;

a slide attached to the enclosure, wherein the slide allows for movement of the enclosure between a retracted position and an extended position relative to the cooling rack; and a plurality of extendable hoses to provide functionality to the enclosure, wherein a first extendable hose and a second extendable hose of the plurality of extendable hoses provide different functions.

10. The apparatus of claim 9, comprising a circulating pump in the enclosure to circulate the liquid coolant.

11. The apparatus of claim 9, wherein the first extendable hose is to allow a flow of the liquid coolant to the enclosure after the enclosure has been moved from the retracted position to the extended position.

12. The apparatus of claim 11, wherein the second extendable hose is to supply power to the enclosure at the retracted position where the enclosure is in the cooling rack, and the second extendable hose does not supply power to the enclosure at the extended position where the enclosure is extended away from the cooling rack.

13. A cooling rack comprising:
a cooling rack frame;
a plurality of removable enclosures, each respective enclosure of the plurality of removable enclosures slidable between a retracted position where the respective enclosure is retracted in the cooling rack frame, and an extended position where the respective enclosure is extended away from the cooling rack frame, the respective enclosure further comprising a top side having cartridge slots in which electronic cartridges are insertable and removable, the electronic cartridges when inserted in the cartridge slots being immersed in a liquid coolant contained in the respective enclosure;

a plurality of extendable hoses to provide functionality to the plurality of removable enclosures, wherein a first extendable hose of the plurality of extendable hoses is to provide the liquid coolant to a first enclosure, and a second extendable hose of the plurality of extendable hoses is to provide power to the first enclosure.

14. The cooling rack of claim 13, further comprising a cooling distribution unit to pump the liquid coolant to the plurality of removable enclosures.

15. The cooling rack of claim 13, wherein the electronic cartridges are removable from the top of the respective enclosure in a first direction that is different from a second direction of sliding of the respective enclosure from the retracted position to the extended position of the respective enclosure.

\* \* \* \* \*